(12) United States Patent
Takahashi et al.

(10) Patent No.: US 7,940,059 B2
(45) Date of Patent: May 10, 2011

(54) METHOD FOR TESTING H-BRIDGE

(75) Inventors: Akihiro Takahashi, Tomiya (JP);
Hidetaka Fukazawa, Miyakoto (JP)

(73) Assignee: Freescale Semiconductor, Inc., Austin, TX (US)

( * ) Notice: Subject to any disclaimer, the term of this patent is extended or adjusted under 35 U.S.C. 154(b) by 379 days.

(21) Appl. No.: 12/198,104

(22) Filed: Aug. 25, 2008

(65) Prior Publication Data
US 2010/0045307 A1 Feb. 25, 2010

(51) Int. Cl.
*H01H 31/02* (2006.01)
(52) U.S. Cl. ........... 324/555; 388/907.2; 318/400.29; 324/713; 324/725; 257/48
(58) Field of Classification Search ........... 324/555; 388/907.2; 318/400.29
See application file for complete search history.

(56) References Cited

U.S. PATENT DOCUMENTS

| | | | | |
|---|---|---|---|---|
| 3,564,363 A | * | 2/1971 | Scholtz | 318/400.29 |
| 5,126,603 A | * | 6/1992 | Hattori | 327/1 |
| 5,210,475 A | * | 5/1993 | Juzswik et al. | 318/293 |
| 5,703,490 A | * | 12/1997 | Kennedy | 324/650 |
| 6,331,794 B1 | * | 12/2001 | Blanchard | 327/112 |
| 2004/0036488 A1 | * | 2/2004 | Shieh et al. | 324/725 |
| 2007/0127182 A1 | * | 6/2007 | Chang et al. | 361/100 |
| 2008/0048706 A1 | * | 2/2008 | Shimizume et al. | 324/765 |
| 2009/0224794 A1 | * | 9/2009 | Hyobu | 324/765 |

FOREIGN PATENT DOCUMENTS

JP 2005-77322 A 3/2005

\* cited by examiner

*Primary Examiner* — Timothy J Dole
*Assistant Examiner* — Benjamin M Baldridge
(74) *Attorney, Agent, or Firm* — Charles Bergere

(57) ABSTRACT

A method for measuring an on resistance in an H-bridge including first and second transistors connected to a first output terminal, third and fourth transistors connected to a second output terminal, and a measurement switch connected to the first and second output terminals. The first and third transistors are connected to a first power supply terminal. The second and fourth transistors are connected to a second power supply terminal. The method includes supplying the first transistor with measurement current during a first period, measuring a first voltage at the first power supply terminal via the third transistor using the second output terminal during the first period, measuring a second voltage at the first output terminal via the measurement switch using the second output terminal during the first period, and determining the on resistance of the first transistor based on the measurement current, first voltage, and second voltage.

8 Claims, 2 Drawing Sheets

FIG. 3A

|  | TM | T1 | T2 | T3 | T4 |
|---|---|---|---|---|---|
| MEASURE VM VOLTAGE USING OUTA | OFF | ON | OFF | ON | OFF |
| MEASURE OUTB VOLTAGE USING OUTA | ON | OFF | OFF | ON | OFF |

FIG. 3B

|  | TM | T1 | T2 | T3 | T4 |
|---|---|---|---|---|---|
| MEASURE PGND VOLTAGE USING OUTA | OFF | OFF | ON | OFF | ON |
| MEASURE OUTB VOLTAGE USING OUTA | ON | OFF | OFF | OFF | ON |

FIG. 3C

|  | TM | T1 | T2 | T3 | T4 |
|---|---|---|---|---|---|
| MEASURE VM VOLTAGE USING OUTB | OFF | ON | OFF | ON | OFF |
| MEASURE OUTA VOLTAGE USING OUTB | ON | ON | OFF | OFF | OFF |

FIG. 3D

|  | TM | T1 | T2 | T3 | T4 |
|---|---|---|---|---|---|
| MEASURE PGND VOLTAGE USING OUTB | OFF | OFF | ON | OFF | ON |
| MEASURE OUTA VOLTAGE USING OUTB | ON | OFF | ON | OFF | OFF |

METHOD FOR TESTING H-BRIDGE

BACKGROUND OF THE INVENTION

The present invention relates to a method for testing an H-bridge, and more particularly, to a method for measuring on resistance in an H-bridge.

An H-bridge (also referred to as a full bridge), which is formed by four transistors, is known as a driver for driving a motor. Nowadays, devices have become smaller and consume less power. This has reduced the size of the transistors used in drivers such as in H-bridges. To ensure the operation of an H-bridge, the performance of the transistors must be tested and accurately evaluated. However, to drive a motor with high efficiency, the on resistance of the transistors used in an H-bridge is particularly small. This presents difficulties when measuring the on resistance of the transistors.

FIG. 1 is a schematic circuit diagram illustrating a prior art process for measuring the on resistance in an H-bridge 10. The H-bridge 10 includes first to fourth transistors T1, T2, T3, and T4, each formed by an NMOS transistor. The drains of the first and third transistors T1 and T3 are connected to a high power supply terminal VM, and the sources of the second and fourth transistors T2 and T4 are connected to a low power supply terminal (ground) PGND. The first and second transistors T1 and T2 are connected in series, with a node therebetween connected to a first output terminal OUTA. In the same manner, the third and fourth transistors T3 and T4 are connected in series, with a node therebetween connected to a second output terminal OUTB. During operation of the H-bridge 10, the first and second output terminals OUTA and OUTB are connected to a motor (not shown). Drive signals S1 and S2 respectively drive the first and second transistors T1 and T2 in a complementary manner, and drive signals S3 and S4 respectively drive the third and fourth transistors T3 and T4 in a complementary manner. When the first transistor T1 is activated, the fourth transistor T4 is activated. In this case, high power supply voltage is output to the first output terminal OUTA, and ground voltage is output to the second output terminal OUTB. When the second transistor T2 is activated, the third transistor T3 is activated. In this case, ground voltage is output to the first output terminal OUTA, and high power supply voltage is output to the second output terminal OUTB. Accordingly, the H-bridge 10 is controllable of the forward turning and reverse turning of the motor.

Automatic test equipment ("ATE") 20, which conducts four-wire measurement, or the so-called Kelvin measurement, is used to measure the on resistance of the H-bridge 10. The ATE 20 includes a test board (not shown) including an IC socket. The IC socket holds an IC, which includes the H-bridge 10. The high power supply terminal VM is supplied with operational voltage VDD. In the prior art, for example, when measuring the on resistance of the third transistor T3, a current source 22 for supplying measurement current I1 is connected between the terminals OUTB and PGND. The ATE 20 measures the voltage V1 at the high voltage terminal VM with a voltmeter 24 connected between the terminals VM and PGND and measures the voltage V2 at the second output terminal OUTB with a voltmeter 26 connected between the terminals OUTB and PGND. The ATE 20 obtains the on resistance of the third transistor T3 based on the measurement voltages V1 and V2 and the measurement current I1. By changing the connection positions of the current source 22 and the voltmeters 24 and 26, the on resistances of the other transistors T1, T2, and T4 can be measured in the same manner.

However, the measuring process of the prior art has a shortcoming in that measurement errors are produced. The measurement errors are produced due to contact resistance between the IC socket and the tested IC (here, the terminals VM, PGND, OUTA, and OUTB) and the resistance of the wiring on the test board from the Kelvin connection point (connection positions of the current source 22 and the voltmeters 24 and 26). For example, in the case shown in FIG. 1, the voltage V1 measured by the voltmeter 24 includes a voltage drop value caused by the contact resistance between the terminals VM and PGND and the wiring resistance between these terminals. In the same manner, the voltage V2 measured by the voltmeter 26 includes a voltage drop value caused by the contact resistance between the terminals OUTB and PGND and the wiring resistance between these terminals. Additionally, if the terminals VM, PGND, OUTA, and OUTB are flawed due to a scratch or dust, variations occur in the contact resistance. Accordingly, the voltages V1 and V2 include errors caused by the voltage drop. As the transistor becomes smaller, the on resistance also becomes smaller. Thus, during the on resistance measurement, the influence of the contact resistance and wiring resistance cannot be ignored.

Japanese Laid-Open Patent Publication No. 2005-77322 describes conducting the Kelvin measurement by contacting a single electrode pad of a semiconductor element with two needles to reduce the contact resistance. However, the electrode pad of a semiconductor element is small. Thus, the testing is difficult since the two needles may fall off from the small electrode pad. Further, the technique of the publication increases the number of pins used in a tester.

BRIEF DESCRIPTION OF THE DRAWINGS

The invention, together with objects and advantages thereof, may best be understood by reference to the following description of the presently preferred embodiments together with the accompanying drawings in which:

FIGS. 3A, 3B, 3C, and 3D are tables illustrating the driving conditions of H-bridge transistors and a measurement transistor during measurement of the on resistance.

DETAILED DESCRIPTION OF THE PREFERRED EMBODIMENTS

Figure 1:
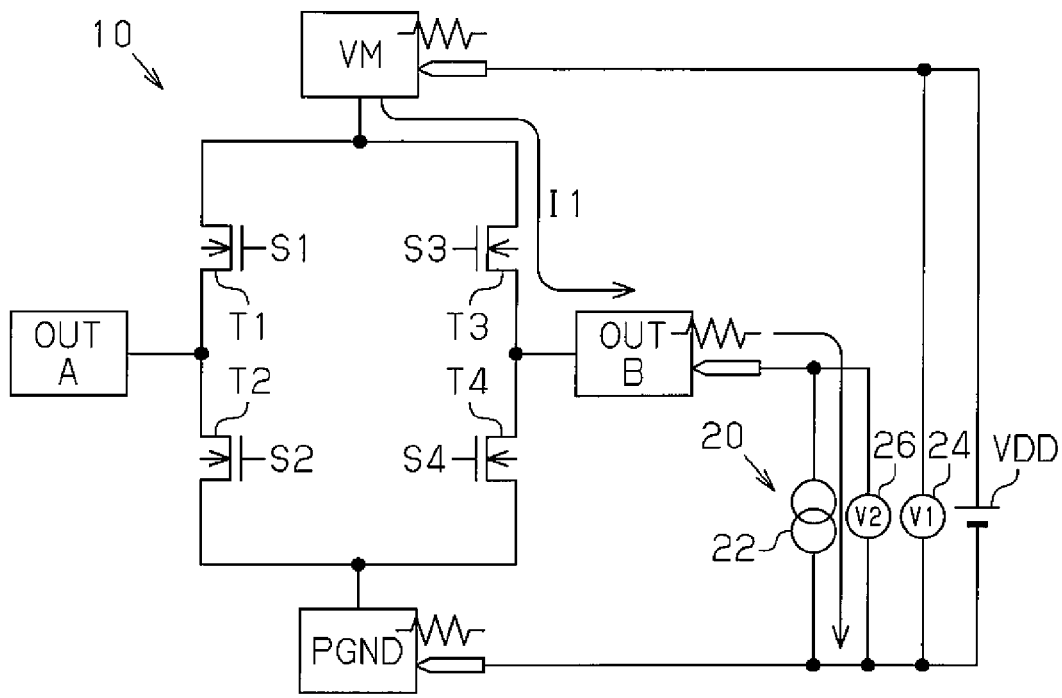
FIG. 1 is a schematic circuit diagram illustrating a prior art process for measuring the on resistance in an H-bridge.

In the drawings, like numerals are used for like elements throughout.

The present invention provides a method for easily and accurately measuring the on resistance of an H-bridge. The present invention also provides an H-bridge used in such a method.

One aspect of the present invention is a method for measuring an on resistance in an H-bridge including first and second transistors connected to a first output terminal, third and fourth transistors connected to a second output terminal, and a measurement switch connected between the first and second output terminals. The first and third transistors are connected to a first power supply terminal. The second and fourth transistors are connected to a second power supply terminal. The method includes supplying the first transistor with measurement current during a first period, measuring a first voltage at the first power supply terminal via the third transistor using the second output terminal during the first period, measuring a second voltage at the first output terminal via the measurement switch using the second output terminal during the first period, and determining the on resistance of the first transistor based on the measurement current, the first voltage, and the second voltage.

A further aspect of the present invention is an H-bridge including first and second transistors connected in series to each other. Third and fourth transistors are connected in series to each other and connected in parallel to the first and second transistors. A measurement switch is connected between a first node located between the first and second transistors and a second node located between the third and fourth transistors.

Other aspects and advantages of the present invention will become apparent from the following description, taken in conjunction with the accompanying drawings, illustrating by way of example the principles of the invention.

Figure 2:
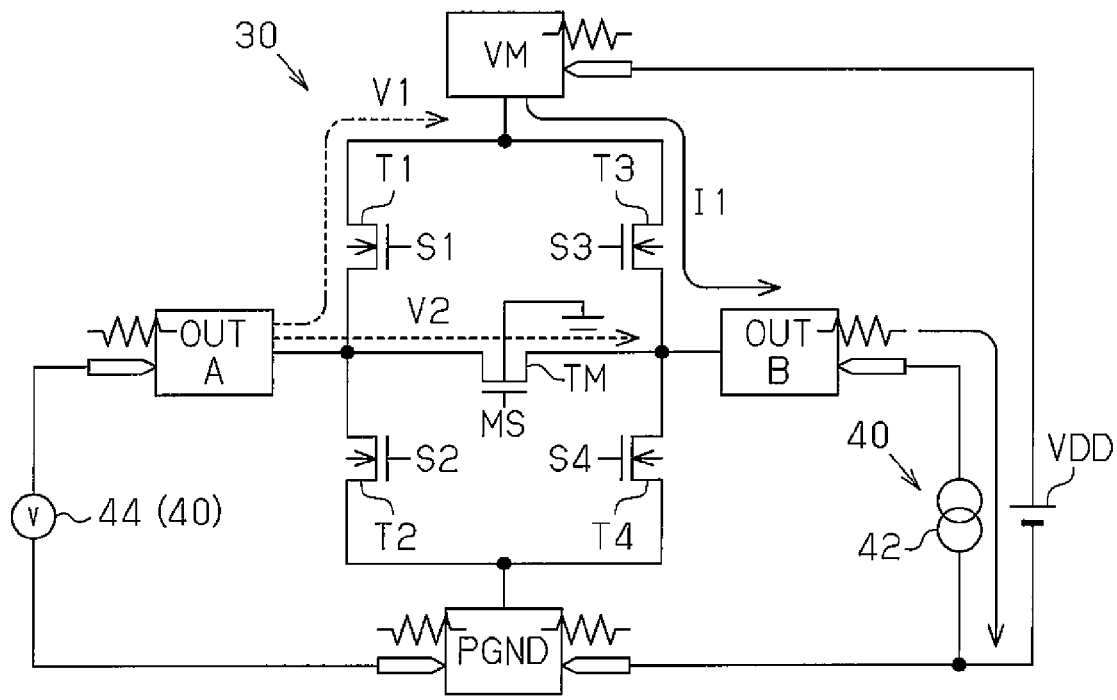
FIG. 2 is a schematic circuit diagram illustrating a preferred embodiment of a process for measuring the on resistance of an H-bridge according to the present invention.

A preferred embodiment of a process for measuring the on resistance of an H-bridge 30 according to the present invention will now be discussed with reference to FIGS. 2 and 3. As shown in FIG. 2, the H-bridge 30 is formed by adding a measurement switch TM to the H-bridge 10 of FIG. 1. The measurement switch TM is formed by, for example, a transistor, preferably, a miniature MOS transistor having a small on resistance (NMOS transistor in FIG. 2). The H-bridge 30 includes first to fourth transistors T1, T2, T3, and T4, each formed by an NMOS transistor. The transistors T1, T2, T3, and T4 of the H-bridge 30 are connected in the same manner as the H-bridge 10 shown in FIG. 1. Further, the transistors T1, T2, T3, and T4 are respectively operated in response to drive signals S1, S2, S3, and S4.

The measurement switch TM is connected between the first and second output terminals OUTA and OUTB. Further, the measurement switch TM has a control terminal (here, the gate of the NMOS transistor) that is provided with a drive signal MS. The measurement switch TM is selectively activated during testing and completely deactivated during non-testing states (normal operation). Accordingly, the H-bridge 30 operates in the same manner as the H-bridge 10 of FIG. 1 during normal operation.

During testing, ATE 40 is used to conduct the Kelvin measurement and measure the on resistance in the H-bridge 30. The high power supply terminal VM is supplied with operational voltage VDD. The ATE 40 includes a current source 42, which is for supplying measurement current I1, and a voltmeter 44. The ATE 20 of the prior art may be used as the ATE 40. However, the Kelvin connection point, specifically, the connection position of the voltmeter 44 (i.e., voltage measurement point) differs from that of the prior art.

The process for measuring the on resistance in the preferred embodiment will now be discussed in detail.

[On Resistance Measurement of Third Transistor T3]

As shown in the state of FIG. 2, the current source 42 is connected between the second output terminal OUTB and the low power supply terminal PGND, and the voltmeter 44 is connected between the first output terminal OUTA and the low power supply terminal PGND. During measurement of the on resistance of the third transistor T3, the measurement current I1 flows to the second output terminal OUTB via the third transistor T3 from the high power supply terminal VM. First, as shown in the upper row of FIG. 3A, the measurement switch TM is deactivated and the first and third transistors T1 and T3 are activated in the H-bridge 30. Under this situation, the ATE 40 uses the first output terminal OUTA to measure the voltage V1 at the high power supply terminal VM (drain voltage of the third transistor T3) with the voltmeter 44. In this state, the measurement current I1 does not flow to the first output terminal OUTA and the low power supply terminal PGND. This prevents the occurrence of a voltage drop caused by the contact resistance at the first output terminal OUTA and the low power supply terminal PGND and the wiring resistance between these terminals. In addition, the on resistance of the first transistor T1 is small such that it may be ignored. Accordingly, the voltage V1 measured by the voltmeter 44 indicates an accurate voltage at the high power supply terminal VM and is substantially free from measurement errors caused by voltage drops. Then, as shown by the lower row in FIG. 3A, the measurement switch TM is activated, and the first transistor T1 is deactivated, with the third transistor T3 remaining activated. Under this situation, the ATE 40 uses the first output terminal OUTA to measure the voltage V2 at the second output terminal OUTB (source voltage of the third transistor T3) with the voltmeter 44. In this state, the measurement current I1 does not flow to the first output terminal OUTA and the low power supply terminal PGND. This prevents the occurrence of a voltage drop caused by the contact resistance at the first output terminal OUTA and the low power supply terminal PGND and the wiring resistance between these terminals. In addition, the on resistance of the measurement switch TM (NMOS transistor) is small such that it may be ignored. Accordingly, the voltage V2 measured by the voltmeter 44 indicates an accurate voltage at the second output terminal OUTB and is substantially free from measurement errors be caused by voltage drops. Thus, the on resistance of the third transistor T3 calculated from the voltages V1 and V2 and the measurement current I1 is accurate.

[On Resistance Measurement of Fourth Transistor T4]

The current source 42 and the voltmeter 44 are connected at the same positions as when measuring the on resistance of the third transistor T3, as shown in the state of FIG. 2. During measurement of the on resistance of the fourth transistor T4, the measurement current I1 flows to the low power supply terminal PGND via the fourth transistor T4 from the second output terminal OUTB. First, as shown in the upper row of FIG. 3B, the measurement switch TM is deactivated and the second and fourth transistors T2 and T4 are activated in the H-bridge 30. Under this situation, the ATE 40 uses the first output terminal OUTA to measure the voltage V3 at the low power supply terminal PGND (source voltage of the fourth transistor T4) with the voltmeter 44. In this state, the measurement current I1 does not flow to the first output terminal OUTA and the low power supply terminal PGND. This prevents the occurrence of a voltage drop caused by the contact resistance at the first output terminal OUTA and the low power supply terminal PGND and the wiring resistance between these terminals. In addition, the on resistance of the second transistor T2 is small such that it may be ignored. Accordingly, the voltage V3 measured by the voltmeter 44 indicates an accurate voltage at the low power supply terminal PGND and is substantially free from measurement errors caused by voltage drops. Then, as shown by the lower row in FIG. 3B, the measurement switch TM is activated, and the second transistor T2 is deactivated, with the fourth transistor T4 remaining activated. Under this situation, the ATE 40 uses the first output terminal OUTA to measure the voltage V4 at the second output terminal OUTB (drain voltage of the fourth transistor T4) with the voltmeter 44. In this state, the measurement current I1 does not flow to the first output terminal OUTA and the low power supply terminal PGND. This prevents the occurrence of a voltage drop caused by the contact resistance at the first output terminal OUTA and the low power supply terminal PGND and the wiring resistance between these terminals. In addition, the on resistance of the measurement switch TM (NMOS transistor) is small such that it may be ignored. Accordingly, the voltage V4 measured by the voltmeter 44 indicates an accurate voltage at the second output terminal OUTB and is substantially free from measurement errors caused by voltage drops. Thus, the on resistance of the fourth transistor T4 calculated from the voltages V3 and V4 and the measurement current I1 is accurate.

[On Resistance Measurement of First Transistor T1]

The current source 42 is connected between the first output terminal OUTA and the low power supply terminal PGND, and the voltmeter 44 is connected between the second output terminal OUTB and the low power supply terminal PGND (not shown). During measurement of the on resistance of the first transistor T1, the measurement current I1 flows to the first output terminal OUTA via the first transistor T1 from the high power supply terminal VM. First, as shown in the upper row of FIG. 3C, the measurement switch TM is deactivated and the first and third transistors T1 and T3 are activated in the H-bridge 30. Under this situation, the ATE 40 uses the second output terminal OUTB to measure the voltage V5 at the high power supply terminal VM (drain voltage of the first transistor T1) with the voltmeter 44. In this state, the measurement current I1 does not flow to the second output terminal OUTB and the low power supply terminal PGND. This prevents the occurrence of a voltage drop caused by the contact resistance at the second output terminal OUTB and the low power supply terminal PGND and the wiring resistance between these terminals. In addition, the on resistance of the third transistor T3 is small such that it may be ignored. Accordingly, the voltage V5 measured by the voltmeter 44 indicates an accurate voltage at the high power supply terminal VM and is substantially free from measurement errors caused by voltage drops. Then, as shown by the lower row in FIG. 3C, the measurement switch TM is activated, and the third transistor T3 is deactivated, with the first transistor T1 remaining activated. Under this situation, the ATE 40 uses the second output terminal OUTB to measure the voltage V6 at the first output terminal OUTA (source voltage of the first transistor T1) with the voltmeter 44. In this state, the measurement current I1 does not flow to the second output terminal OUTB and the low power supply terminal PGND. This prevents the occurrence of a voltage drop caused by the contact resistance at the second output terminal OUTB and the low power supply terminal PGND and the wiring resistance between these terminals. In addition, the on resistance of the measurement switch TM (NMOS transistor) is small such that it may be ignored. Accordingly, the voltage V2 measured by the voltmeter 44 indicates an accurate voltage at the first output terminal OUTA and is substantially free from measurement errors caused by voltage drops. Thus, the on resistance of the first transistor T1 calculated from the voltages V5 and V6 and the measurement current I1 is accurate.

[On Resistance Measurement of Second Transistor T2]

The current source 42 and the voltmeter 44 are connected at the same positions as when measuring the on resistance of the first transistor T1 (not shown). During measurement of the on resistance of the second transistor T2, the measurement current I1 flows to the low power supply terminal PGND via the second transistor T2 from the first output terminal OUTA. First, as shown in the upper row of FIG. 3D, the measurement switch TM is deactivated and the second and fourth transistors T2 and T4 are activated in the H-bridge 30. Under this situation, the ATE 40 uses the second output terminal OUTB to measure the voltage V7 at the low power supply terminal PGND (source voltage of the second transistor T2) with the voltmeter 44. In this state, the measurement current I1 does not flow to the second output terminal OUTB and the low power supply terminal PGND. This prevents the occurrence of a voltage drop caused by the contact resistance at the second output terminal OUTB and the low power supply terminal PGND and the wiring resistance between these terminals. In addition, the on resistance of the fourth transistor T4 is small such that it may be ignored. Accordingly, the voltage V7 measured by the voltmeter 44 indicates an accurate voltage at the low power supply terminal PGND and is substantially free from measurement errors caused by voltage drops. Then, as shown by the lower row in FIG. 3D, the measurement switch TM is activated, and the fourth transistor T4 is deactivated, with the second transistor T2 remaining activated. Under this situation, the ATE 40 uses the first output terminal OUTA to measure the voltage V8 at the first output terminal OUTA (drain voltage of the first transistor T1) with the voltmeter 44. In this state, the measurement current I1 does not flow to the second output terminal OUTB and the low power supply terminal PGND. This prevents the occurrence of a voltage drop caused by the contact resistance at the second output terminal OUTB and the low power supply terminal PGND and the wiring resistance between these terminals. In addition, the on resistance of the measurement switch TM (NMOS transistor) is small such that it may be ignored. Accordingly, the voltage V8 measured by the voltmeter 44 indicates an accurate voltage at the first output terminal OUTA and is substantially free from measurement errors caused by voltage drops. Thus, the on resistance of the second transistor T2 calculated from the voltages V7 and V8 and the measurement current I1 is accurate.

The on resistance measurement method of the preferred embodiment has the advantages described below.

The source voltage and drain voltage of each of the transistors T1 to T4 are measured using the terminal (OUTA or OUTB) in which the measurement current I1 does not flow. Thus, the on resistance of each of the transistors T1 to T4 is accurately measured without being affected by contact resistance and wiring resistance in Kelvin measurements.

The output terminal (OUTA or OUTB) opposite to the output terminal connected to the current source 42 is used to measure the source voltage and drain voltage of each of the transistors T1 to T4. In other words, voltage measurement is performed using a vacant terminal of the H-bridge 30. Thus, the number of test terminals is not increased.

The source voltage and drain voltage of a transistor are measured using the same output terminal (OUTA or OUTB). This reduces measurement errors in comparison to when using different terminals. For example, in the prior art method illustrated in FIG. 1, the drain voltage and source voltage of the third transistor T3 are measured using the high power supply terminal VM and the second output terminal OUTB, respectively. Thus, a measurement error is apt to occur. In the preferred embodiment illustrated in FIG. 2, the drain voltage and source voltage of the third transistor T3 are measured using the same output terminal OUTA. Thus, the influence of measurement errors, assuming that there are measurement errors, is small.

The H-bridge 30 is formed by adding the measurement switch TM to the H-bridge 10 of the prior art. Accordingly, the circuit scale is practically the same as that of the H-bridge 10 of the prior art.

It should be apparent to those skilled in the art that the present invention may be embodied in many other specific forms without departing from the spirit or scope of the invention. Particularly, it should be understood that the present invention may be embodied in the following forms.

The measurement switch TM may be a PMOS transistor. Alternatively, the measurement switch TM may be a bipolar transistor. Further, the transistors T1 to T4 of the H-bridge 30 may also be bipolar transistors.

The present examples and embodiments are to be considered as illustrative and not restrictive, and the invention is not to be limited to the details given herein, but may be modified within the scope and equivalence of the appended claims.

What is claimed is:

1. A method for measuring an on resistance in an H-bridge including first and second transistors connected to a first output terminal, third and fourth transistors connected to a second output terminal, and a measurement switch connected between the first and second output terminals, in which the first and third transistors are connected to a first power supply terminal, and the second and fourth transistors are connected to a second power supply terminal, the method comprising:
   supplying the first transistor with measurement current during a first period;
   measuring a first voltage at the first power supply terminal via the third transistor using the second output terminal during the first period;
   measuring a second voltage at the first output terminal via the measurement switch using the second output terminal during the first period; and
   determining the on resistance of the first transistor based on the measurement current, the first voltage, and the second voltage.

2. The method for measuring an on resistance in an H-bridge of claim 1, further comprising:
   connecting a voltmeter between the second output terminal and the second power supply terminal to measure the first voltage and second voltage with the voltmeter.

3. The method for measuring an on resistance in an H-bridge of claim 1, further comprising:
   supplying the second transistor with the measurement current during a second period;
   measuring a third voltage at the first power supply terminal via the fourth transistor using the second output terminal during the second period;
   measuring a fourth voltage at the first output terminal via the measurement switch using the second output terminal during the second period; and
   determining the on resistance of the second transistor based on the measurement current, the third voltage, and the fourth voltage.

4. The method for measuring an on resistance in an H-bridge of claim 3, further comprising:
   connecting a voltmeter between the second output terminal and the second power supply terminal to measure the first voltage, second voltage, third voltage, and fourth voltage with the voltmeter.

5. The method for measuring an on resistance in an H-bridge of claim 1, further comprising:
   supplying the third transistor with the measurement current during a third period;
   measuring a fifth voltage at the first power supply terminal via the first transistor using the first output terminal during the third period;
   measuring a sixth voltage at the second output terminal via the measurement switch using the first output terminal during the third period; and
   determining the on resistance of the third transistor based on the measurement current, the fifth voltage, and the sixth voltage.

6. The method for measuring an on resistance in an H-bridge of claim 5, further comprising:
   connecting a voltmeter between the first output terminal and the second power supply terminal to measure the fifth voltage and sixth voltage with the voltmeter.

7. The method for measuring an on resistance in an H-bridge of claim 1, further comprising:
   supplying the fourth transistor with the measurement current during a fourth period;
   measuring a seventh voltage at the second power supply terminal via the second transistor using the first output terminal during the fourth period;
   measuring an eighth voltage at the second output terminal via the measurement switch using the first output terminal during the fourth period; and
   determining the on resistance of the fourth transistor based on the measurement current, the seventh voltage, and the eighth voltage.

8. The method for measuring an on resistance in an H-bridge of claim 7, further comprising:
   connecting a voltmeter between the first output terminal and the second power supply terminal to measure the seventh voltage and eighth voltage with the voltmeter.

* * * * *